(12) United States Patent
Terao et al.

(10) Patent No.: US 12,278,653 B2
(45) Date of Patent: Apr. 15, 2025

(54) DELTA SIGMA MODULATOR

(71) Applicant: Nippon Telegraph and Telephone Corporation, Tokyo (JP)

(72) Inventors: Naoki Terao, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 90 days.

(21) Appl. No.: 18/041,968

(22) PCT Filed: Sep. 15, 2020

(86) PCT No.: PCT/JP2020/034883
§ 371 (c)(1),
(2) Date: Feb. 16, 2023

(87) PCT Pub. No.: WO2022/059060
PCT Pub. Date: Mar. 24, 2022

(65) Prior Publication Data
US 2024/0030933 A1    Jan. 25, 2024

(51) Int. Cl.
*H03M 3/00* (2006.01)
(52) U.S. Cl.
CPC ............ *H03M 3/39* (2013.01); *H03M 3/344* (2013.01); *H03M 3/43* (2013.01); *H03M 3/454* (2013.01); *H03M 3/458* (2013.01)
(58) Field of Classification Search
CPC .......... H03M 3/39; H03M 3/344; H03M 3/43; H03M 3/458; H03M 3/454
USPC ....................................................... 341/143
See application file for complete search history.

(56) References Cited

U.S. PATENT DOCUMENTS

| | | | |
|---|---|---|---|
| 8,823,567 B2 | 9/2014 | Mitani et al. | |
| 8,957,797 B2* | 2/2015 | Weng | H03M 3/324 |
| | | | 341/119 |
| 2011/0028089 A1 | 2/2011 | Komori | |
| 2021/0265981 A1* | 8/2021 | Camponeschi | H03M 3/438 |

FOREIGN PATENT DOCUMENTS

| | | |
|---|---|---|
| JP | 2011030036 A | 2/2011 |
| JP | 2013098630 A | 5/2013 |
| JP | 2018170694 A | 11/2018 |
| WO | 2011089661 A1 | 7/2011 |

OTHER PUBLICATIONS

"Low-Noise, Low-Distortion Instrumentation Amplifier," Burr-Brown Products, Texas Instruments Corp., INA163, Nov. 2000, Revised May 2005, 15 pages.
Waho et al., "Understanding Delta sigma Data Converters," Maruzen Publishing Co., Ltd., p. 25, 2007, ISBN-13:978-4621078723, Japan, 2 pages. As discussed in the specification.

* cited by examiner

*Primary Examiner* — Khai M Nguyen
(74) *Attorney, Agent, or Firm* — Slater Matsil, LLP

(57) ABSTRACT

A delta sigma modulator includes: an integrator that integrates differences between input signals and output signals of the delta sigma modulator; and a clocked comparator that outputs the output signals that are results of comparison between an output of the integrator and a threshold, at a timing synchronized with a clock signal. The integrator includes an operational amplifier, input resistors, feedback capacitors, and compensation inductors.

9 Claims, 9 Drawing Sheets

DELTA SIGMA MODULATOR

CROSS-REFERENCE TO RELATED APPLICATIONS

This application is a national phase entry of PCT Application No. PCT/JP2020/034883, filed on Sep. 15, 2020, which application is hereby incorporated herein by reference.

TECHNICAL FIELD

The present invention relates to a semiconductor integrated circuit, and more particularly, to a delta sigma modulator that is a component of a delta sigma analog-to-digital converter that is a kind of analog-to-digital converter.

BACKGROUND

An analog-to-digital converter (ADC) is a circuit that converts an analog signal into a digital signal at a timing synchronized with a clock signal. An error occurs when the original analog signal is quantized into a digital value of a finite number of steps. This error is called a quantization error or quantization noise. There are many types of ADCs, but a delta sigma ADC is effective in reducing quantization errors. A delta sigma ADC is formed with a delta sigma modulator and a decimation filter.

Delta sigma modulators are now briefly described. There are two types of delta sigma modulators: continuous-time delta sigma modulators formed with analog circuits, and a discrete-time delta sigma modulators formed with digital circuits. Here, a first-order low-pass delta sigma modulator that is a fundamental component of a continuous-time delta sigma modulator is described.

Figure 6:
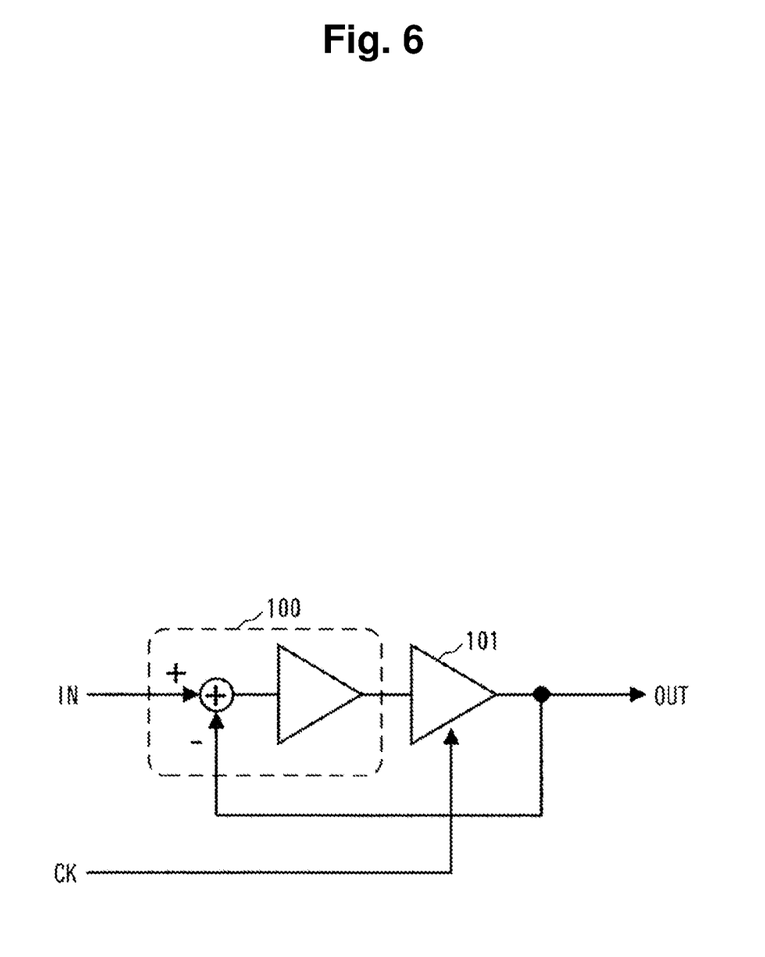
FIG. 6 is a block diagram illustrating a configuration of a conventional delta sigma modulator.

FIG. 6 illustrates a simplified configuration of a delta sigma modulator. The delta sigma modulator includes an integrator 100 and a clocked comparator 101 (see Non Patent Literature 1). The integrator 100 integrates differences between an input signal IN and an output signal OUT. The clocked comparator 101 evaluates an input value from the integrator 100 at a timing synchronized with a clock signal CK, and outputs a high value when the input value is higher than a threshold, and outputs a low value when the input value is lower than the threshold. An output signal OUT of the clocked comparator 101 is an output signal of the delta sigma modulator. This output signal OUT is negatively fed back to the input of the integrator 100.

Figure 7:
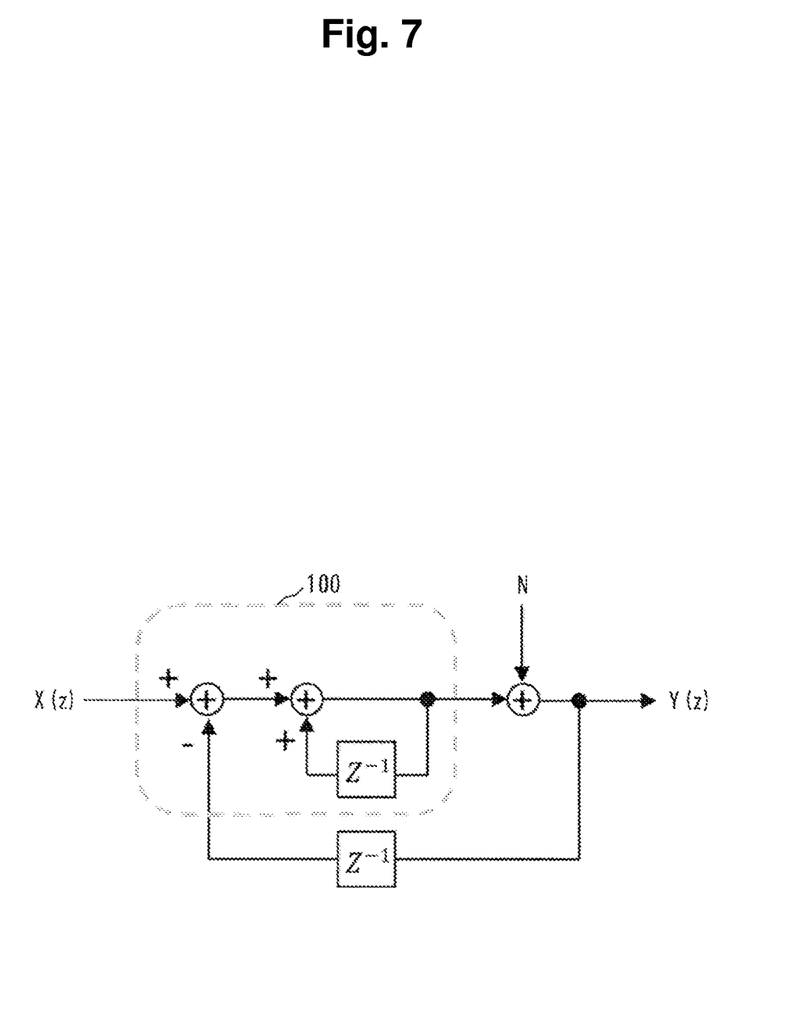
FIG. 7 is a block diagram illustrating a model of a conventional delta sigma modulator in the Z region.

An operation model of the delta sigma modulator illustrated in FIG. 6 is now briefly described. FIG. 7 is a block diagram illustrating a model of the delta sigma modulator in the Z region. $X(z)$ represents an input, $Y(z)$ represents an output, and $z^{-1}$ represents a time delay per unit time $T_s=1/f_s$. $T_s$ corresponds to a cycle of the clock signal CK in FIG. 6. N represents the quantization noise to be superimposed on the signal by the clocked comparator 101.

From the block diagram shown in FIG. 7, the transfer function of the delta sigma modulator is expressed by the following equation.

[Mathematical Expression 1]

$$Y(z) = X(z) + (1 - z^{-1})N \qquad (1)$$

The coefficient relating to the quantization noise N is called the noise transfer function (NTF). The NTF can be expressed as in the following equation.

[Mathematical Expression 2]

$$NTF = 1 - z^{-1} \qquad (2)$$

When $z = e^{j2\pi f/f_s}$ is used, Expression (2) turns into Expression (3) in which $f \ll f_s$.

[Mathematical Expression 3]

$$NTF \approx \frac{2\pi f}{f_s} \qquad (3)$$

As can be seen from Expression (3), the NTF is proportional to the frequency f. That is, the frequency characteristics of the NTF are small in a low-frequency region, and are large in a high-frequency region. Because of this, the frequency distribution of the quantization noise in the band can be biased toward the high-frequency side. This bias of the frequency distribution is called noise shaping, and is a feature of a delta sigma modulator. As already mentioned, a delta sigma ADC is formed with a delta sigma modulator and a decimation filter. By removing the quantization noise biased toward the high-frequency side with the decimation filter in the subsequent stage, it is possible to realize AD conversion having an excellent signal-to-quantization noise ratio.

Figure 8:
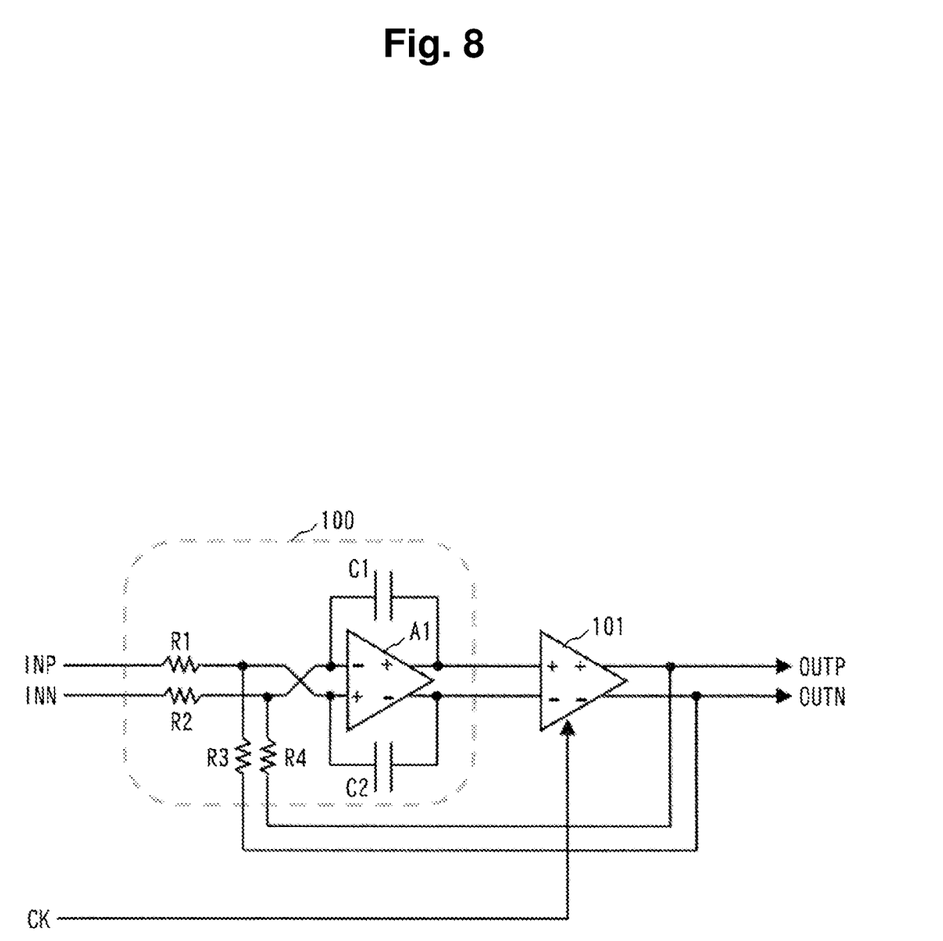
FIG. 8 is a block diagram illustrating a specific example configuration of a conventional delta sigma modulator.

FIG. 8 illustrates a specific example configuration of the delta sigma modulator modeled in FIGS. 6 and 7. The configuration illustrated in FIG. 8 is disclosed in Non Patent Literature 1. The integrator 100 is formed by adding input resistors R1 to R4 and feedback capacitors C1 and C2 to an operational amplifier A1, as illustrated in FIG. 8. Input signals INP and INN, and the output signals OUTP and OUTN have a differential configuration. The positive-phase output signal OUTP is fed back to the side of the negative-phase input signal INN, and the negative-phase output signal OUTN is fed back to the side of the positive-phase input signal INP. Thus, negative feedback is performed.

Using high-frequency transistors such as bipolar transistors is normally effective in designing a delta sigma modulator that is compatible with higher-frequency clocks or has a higher conversion rate. However, if high-frequency transistors are used, the signal-to-quantization noise ratio is degraded particularly in low-frequency regions. This problem will be described below in detail.

In general, a high-frequency transistor tends to have a lower amplification factor than a transistor not compatible with high-frequency operations. Designing a delta sigma modulator using such high-frequency transistors is now considered. In a case where the integrator 100 is formed with the operational amplifier A1, the input resistors R1 to R4, and the feedback capacitors C1 and C2 as illustrated in FIG. 8, the frequency characteristics $H(f)$ of the gain of the integrator 100 is expressed as shown below, where the amplification factor of the operational amplifier A1 is represented by A, the values of the input resistors R1 to R4 are represented by R, and the values of the feedback capacitors C1 and C2 are represented by C.

[Mathematical Expression 4]

$$H(f) = \frac{A}{1 + j2\pi f RC(1 + A)} \qquad (4)$$

Expression (4) can be approximated as shown in Expression (6), where a frequency $f_{cutoff}$ is defined as shown in Expression (5).

[Mathematical Expression 5]

$$f_{cutoff} = \frac{1}{2\pi RC(1+A)} \quad (5)$$

[Mathematical Expression 6]

$$H(f) \approx \begin{cases} A & (f < f_{cutoff}) \\ \frac{A}{j2\pi fRC(1+A)} & (f > f_{cutoff}) \end{cases} \quad (6)$$

That is, the configuration in which the operational amplifier A1, the input resistors R1 to R4, and the feedback capacitors C1 and C2 are combined exhibits integral characteristics in the region where the frequency f is higher than $f_{cutoff}$, but the amplification factor approaches a constant value A without depending on the frequency in the region where the frequency f is lower than $f_{cutoff}$. The frequency $f_{cutoff}$ can be roughly regarded as the frequency at which the gain of the integrator 100 switches from a flat region to a region of integral characteristics, and is the frequency at which the gain drops from DC gain by 3 dB. The frequency $f_{cutoff}$ is called the cutoff frequency.

As can be seen from Expression (5), in a case where the amplification factor A of the operational amplifier A1 is sufficiently high, which is a case where transistors having a sufficiently high amplification factor are used, the cutoff frequency $f_{cutoff}$ is on the side of sufficiently low frequency with respect to the signal band being handled. In this case, the integrator 100 exhibits integral characteristics in most frequency bands, and therefore, degradation of the signal-to-quantization noise ratio is not regarded as a serious problem. However, in a case where the amplification factor A of the operational amplifier A1 is not sufficiently high in practice, the frequency region in which the gain of the integrator 100 is flat is wider.

Figure 9:
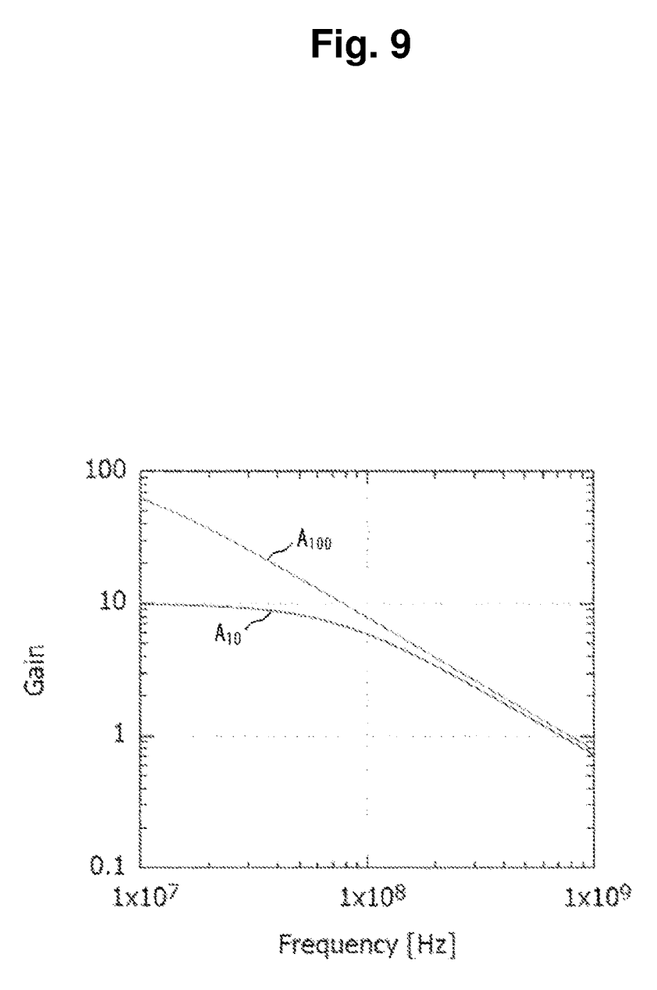
FIG. 9 is a diagram illustrating the results of simulations of frequency characteristics of the gain of an integrator in a conventional delta sigma modulator.

A specific example of the above description is now shown. FIG. 9 illustrates the results of simulations of operation of the integrator 100 in a case where the amplification factor of the operational amplifier A1 is A=10, and in a case where A=100. Here, C=1 pF, and R=200Ω. In FIG. 9, $G_{10}$ indicates the gain in the case where A=10, and $G_{100}$ indicates the gain in the case where A=100.

From Expression (5), the cutoff frequency $f_{cutoff}$ in the case where A=10 is calculated to be about 72 MHz, and the cutoff frequency $f_{cutoff}$ in the case where A=100 is calculated to be about 8 MHz. Roughly speaking, at any frequency equal to or higher than the cutoff frequency $f_{cutoff}$, the integrator 100 exhibits integral characteristics in both cases where A=10 and A=100. On the other hand, in the case where A=10, the gain of the integrator 100 does not increase sufficiently in any band equal to or lower than the cutoff frequency $f_{cutoff}$=72 MHz, and is limited by the amplification factor A of the operational amplifier A1.

Therefore, in any band equal to or lower than the cutoff frequency $f_{cutoff}$, the delta sigma modulation is not complete, and sufficient noise shaping is not achieved, as already mentioned. As a result, the signal-to-quantization noise ratio drops. When the number of stages of the operational amplifier A1 is increased so as to enhance the gain of the integrator 100, the input/output delay time becomes longer, and the characteristics deviate from the ideal characteristics particularly in designing a high-speed delta sigma modulator.

As described above, in a case where the amplification factor of the transistors being used is not sufficiently high, the frequency characteristics of the integrator of the conventional delta sigma modulator is flat in low-frequency regions. Therefore, the noise transfer function is degraded, and the signal-to-quantization noise ratio is lowered.

CITATION LIST

Non Patent Literature

Non Patent Literature 1: Takao WAHO and Akira YASUDA, "Understanding Delta sigma Data Converters", Maruzen Publishing Co., Ltd., p. 25, 2007, ISBN-13: 978-4621078723

SUMMARY

Technical Problem

Embodiments of the present invention have been made to solve the above problem, and aims to provide a delta sigma modulator capable of achieving both high-speed operation and excellent signal-to-quantization noise ratio.

Solution to Problem

A delta sigma modulator according to embodiments of the present invention includes: an integrator configured to integrate difference between an input signal and an output signal of the delta sigma modulator; and a clocked comparator configured to output a result of comparison between an output of the integrator and a threshold at timing synchronized with a clock signal, the result being output as the output signal of the delta sigma modulator. The integrator includes: an operational amplifier; an input resistor that has one end to which the input signal is input, and the other end connected to an input terminal of the operational amplifier; a feedback capacitor that is connected between the input terminal and an output terminal of the operational amplifier; and an inductor that is connected in parallel to the input resistor.

Advantageous Effects of Embodiments of Invention

According to embodiments of the present invention, an inductor is provided in parallel with an input resistor of an integrator, so that the characteristics of the integrator are enhanced on the low-frequency side, and integral characteristics can be achieved in a wider frequency band. As a result, degradation of the signal-to-quantization noise ratio in a delta sigma modulator can be reduced even in a case where high-frequency transistors are used for the transistors of the integrator, and thus, both high-speed operation and an excellent signal-to-quantization noise ratio can be achieved with embodiments of the present invention.

DETAILED DESCRIPTION OF ILLUSTRATIVE EMBODIMENTS

Principles of Embodiments of the Invention

In embodiments of the present invention, inductors that compensate for degradation of the noise transfer function in low-frequency regions are added to the circuit configuration of a delta sigma modulator. With the addition of inductors, the characteristics of the integrator are enhanced on the low-frequency side, and integral characteristics can be achieved in a wider frequency band.

First Embodiment

Figure 1:
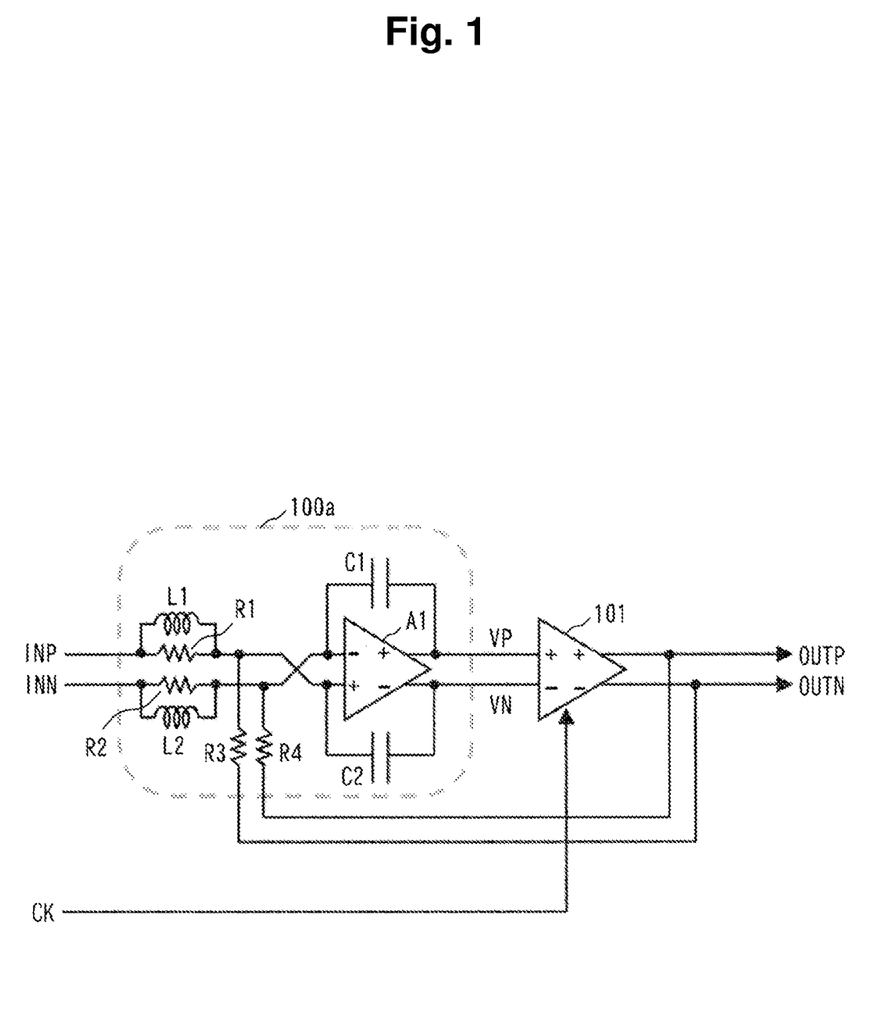
FIG. 1 is a block diagram illustrating a configuration of a delta sigma modulator according to a first embodiment of the present invention.

The following is a description of embodiments of the present invention, with reference to the drawings. FIG. 1 is a block diagram illustrating a configuration of a delta sigma modulator according to a first embodiment of the present invention. The delta sigma modulator of this embodiment includes: an integrator 100a that integrates differences between input signals INP and INN and output signals OUTP and OUTN of the delta sigma modulator; and a clocked comparator 101 that outputs the output signals OUTP and OUTN that are results of comparison between an output of the integrator 100a and a threshold, at a timing synchronized with a clock signal CK.

The input signals INP and INN, and the output signals OUTP and OUTN have a differential configuration, as in the conventional example.

The integrator 100a includes: an operational amplifier A1; an input resistor R1 that has one end to which the positive-phase input signal INP is input, and the other end connected to a positive-phase input terminal of the operational amplifier A1; an input resistor R2 that has one end to which the negative-phase input signal INN is input, and the other end connected to a negative-phase input terminal of the operational amplifier A1; an input resistor R3 that has one end connected to a negative-phase output terminal of the clocked comparator 101, and the other end connected to the positive-phase input terminal of the operational amplifier A1; an input resistor R4 that has one end connected to a positive-phase output terminal of the clocked comparator 101, and the other end connected to the negative-phase input terminal of the operational amplifier A1; a feedback capacitor C1 that has one end connected to the negative-phase input terminal of the operational amplifier A1, and the other end connected to the positive-phase output terminal of the operational amplifier A1; a feedback capacitor C2 that has one end connected to the positive-phase input terminal of the operational amplifier A1, and the other end connected to the negative-phase output terminal of the operational amplifier A1; a compensation inductor L1 connected in parallel to the input resistor R1; and a compensation inductor L2 connected in parallel to the input resistor R2.

A positive-phase output signal VP of the operational amplifier A1 is input to the positive-phase input terminal of the clocked comparator 101, and a negative-phase output signal VN of the operational amplifier A1 is input to the negative-phase input terminal of the clocked comparator 101.

According to this embodiment, the integral characteristics of the integrator 100a can be extended toward the low-frequency side by the effects of the compensation inductors L1 and L2. In the description below, the effects of this embodiment are described in detail.

The frequency characteristics H(f) of the gain of the integrator 100a are expressed as follows.

[Mathematical Expression 7]

$$H(f) = \frac{A}{1 + \frac{j2\pi fRC}{1 + \frac{R}{j2\pi fL}}(1+A)} \quad (7)$$

In Expression (7), A represents the gain of the operational amplifier A1, R represents the value of the input resistors R1 and R2, C represents the value of the feedback capacitors C1 and C2, and L represents the value of the compensation inductors L1 and L2. In terms of frequency, the frequency characteristics H(f) can be approximated as shown in Expression (8).

[Mathematical Expression 8]

$$H(f) \approx \begin{cases} A & \left(f < \frac{1}{\sqrt{LC(1+A)}}\right) \\ \frac{A}{4\pi^2 f^2 LC(1+A)} & \left(\frac{1}{\sqrt{LC(1+A)}} < f < \frac{1}{2\pi RC(1+A)}\right) \\ \frac{A}{j2\pi fRC(1+A)} & \left(f > \frac{1}{2\pi RC(1+A)}\right) \end{cases} \quad (8)$$

[Mathematical Expression 9]

$$\frac{1}{\sqrt{LC(1+A)}} < f < \frac{1}{2\pi RC(1+A)} \quad (9)$$

As can be seen from Expression (8), characteristics close to those of a second-order low-pass filter formed with the compensation inductors L1 and L2 and the feedback capacitors C1 and C2 are obtained in the band indicated by Expression (9). Thus, according to this embodiment, it is possible to cancel the degradation of the integral characteristics of the integrator 100a at low frequency, and extend the integral characteristics toward the low-frequency side.

Figure 2:
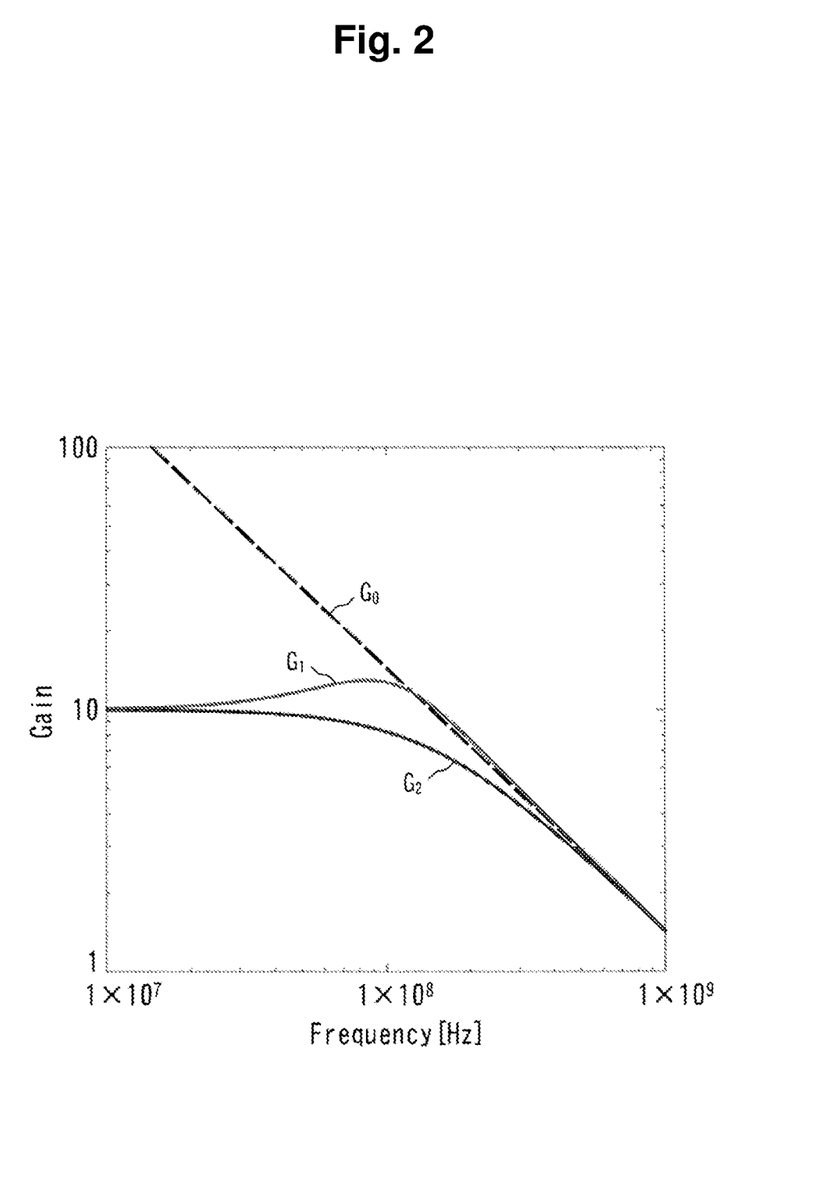
FIG. 2 is a diagram illustrating the results of simulations of the frequency characteristics of the gain of an integrator in the delta sigma modulator according to the first embodiment of the present invention.

To confirm the effectiveness of the above description, FIG. 2 shows the results of simulations performed through simple numerical calculations. Here, the gain A of the operational amplifier A1 is 10, the value R of the input resistors R1 to R4 is 200 n, the value C of the feedback capacitors C1 and C2 is 500 fF, and the value L of the compensation inductors L1 and L2 is 400 nH. In FIG. 2, $G_1$ indicates the gain of the integrator 100a in the presence of the compensation inductors L1 and L2, and $G_2$ indicates the gain of the integrator 100a in the absence of the compensation inductors L1 and L2. $G_0$ indicates the frequency characteristics of an ideal integrator using an operational amplifier having an infinite gain.

As can be seen from FIG. 2, the compensation inductors L1 and L2 maintain the integral characteristics on the lower-frequency side. The frequency at which the gain becomes 1 dB lower than the characteristics of the ideal integrator is about 284 MHz in the absence of the compensation inductors L1 and L2, and is about 102 MHz in the presence of the compensation inductors L1 and L2. That is, in this embodiment, compensation is conducted with the inductors L1 and L2, so that the bandwidth with the flat frequency characteristics can be reduced to ½ or less of that in a conventional case.

Figure 3:
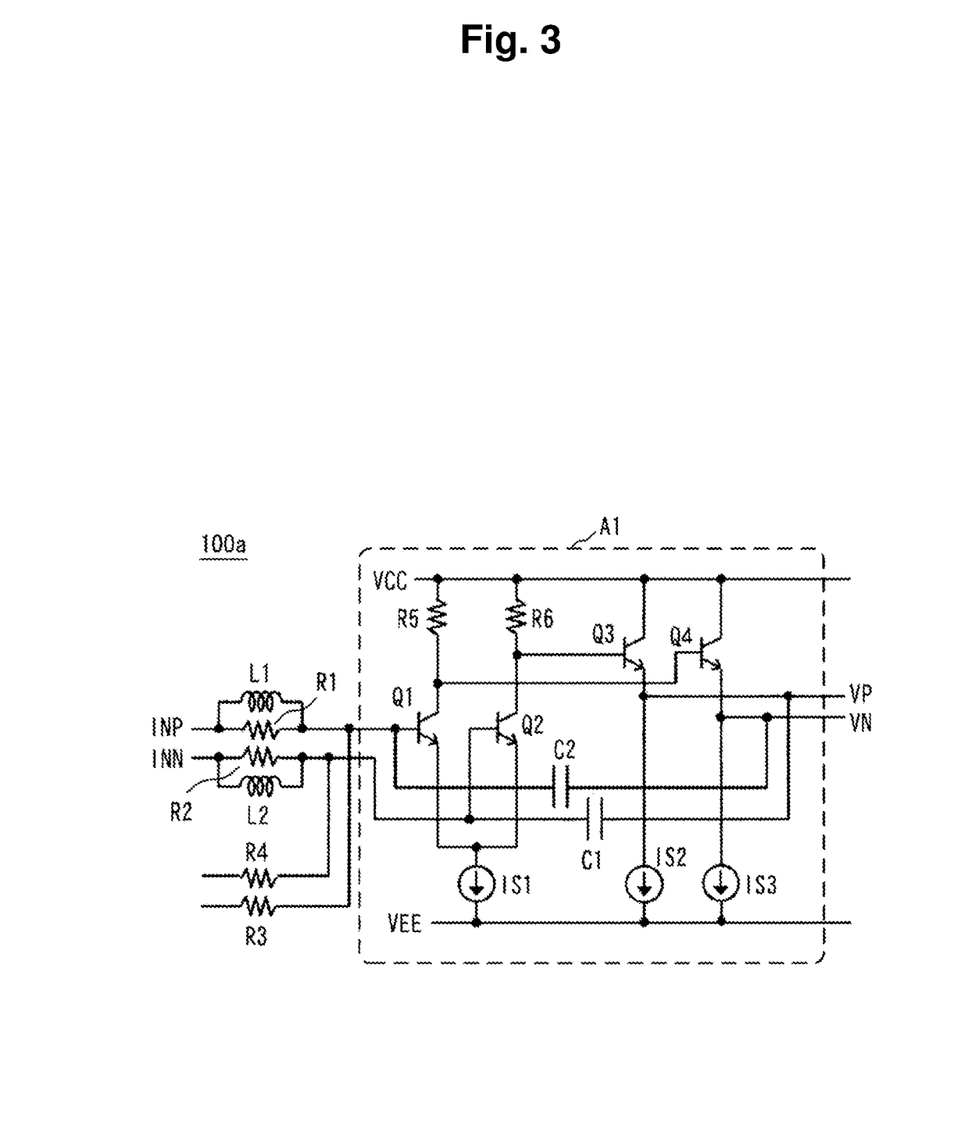
FIG. 3 is a circuit diagram illustrating a specific example configuration of the integrator of the delta sigma modulator according to the first embodiment of the present invention.

FIG. 3 illustrates an example circuit configuration of the integrator 100a. The operational amplifier A1 of the integrator 100a includes: a transistor Q1 that has a base terminal connected to the positive-phase input terminal of the operational amplifier A1; a transistor Q2 that has a base terminal connected to the negative-phase input terminal of the operational amplifier A1; a transistor Q3 that has a base terminal connected to a collector terminal of the transistor Q2, an emitter terminal connected to the positive-phase output terminal of the operational amplifier A1, and a collector terminal connected to a power supply voltage VCC; a transistor Q4 that has a base terminal connected to a collector terminal of the transistor Q1, an emitter terminal connected to the negative-phase output terminal of the operational amplifier A1, and a collector terminal connected to the power supply voltage VCC; a load resistor R5 that has one end connected to the power supply voltage VCC, and the other end connected to the collector terminal of the transistor Q1; a load resistor R6 that has one end connected to the power supply voltage VCC, and the other end connected to the collector terminal of the transistor Q2; a constant current source IS1 that has one end connected to the emitter terminals of the transistors Q1 and Q2, and the other end connected to a power supply voltage VEE; a constant current source IS2 that has one end connected to the emitter terminal of the transistor Q3, and the other end connected to the power supply voltage VEE; and a constant current source IS3 that has one end connected to the emitter terminal of the transistor Q4, and the other end connected to the power supply voltage VEE.

Second Embodiment

As is apparent from Expression (9), in the first embodiment, a large inductance is required when compensation is conducted in a lower-frequency region, and a large area is required when a delta sigma modulator is formed with an integrated circuit.

Figure 4:
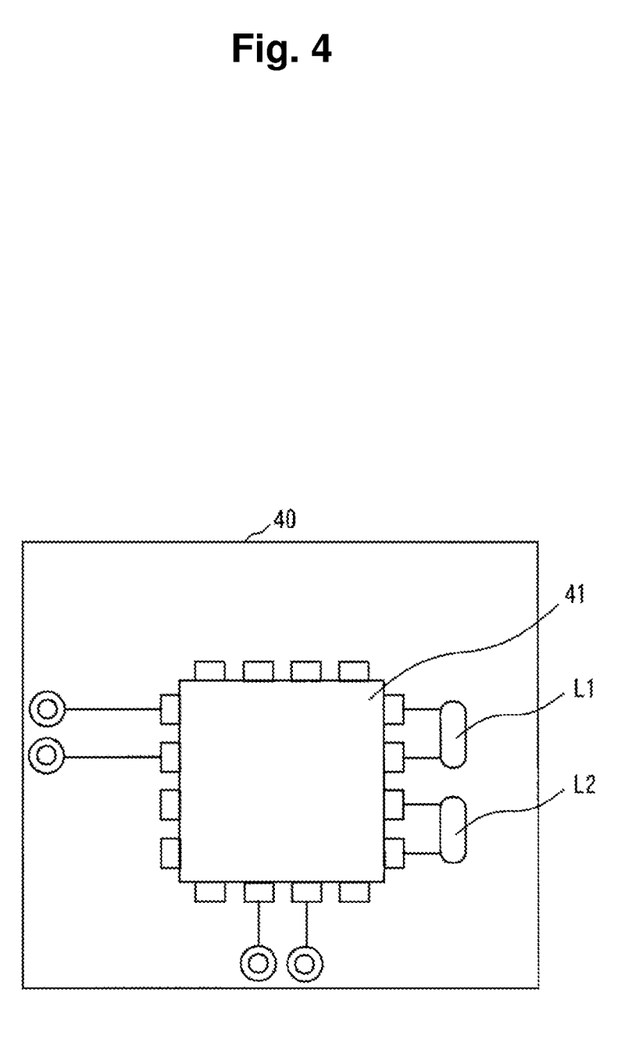
FIG. 4 is a plan view illustrating a mode in which a delta sigma modulator according to a second embodiment of the present invention is mounted on a printed circuit board.

In this embodiment, inductors L1 and L2 are added in an off-chip manner. As a result, large inductors L1 and L2 can be used, regardless of the circuit area, and thus, the integral characteristics can be compensated in lower-frequency regions. FIG. 4 is a plan view illustrating a mode in which a delta sigma modulator of this embodiment is mounted on a printed circuit board 40. As illustrated in FIG. 4, the compensation inductors L1 and L2 are mounted not in the integrated circuit package 41 of the delta sigma modulator, but on the printed circuit board 40 outside the package.

Third Embodiment

In the first and second embodiments, first-order delta sigma modulators have been described. In general, a delta sigma modulator can obtain stronger noise shaping by cascade-connecting a plurality of integrators. An Nth-order delta sigma modulator is designed with N integrators (N being an integer of 2 or greater) and one clocked comparator. Noise shaping degradation compensation in a low-frequency region by compensation inductors is also effective in an Nth-order delta sigma modulator.

Figure 5:
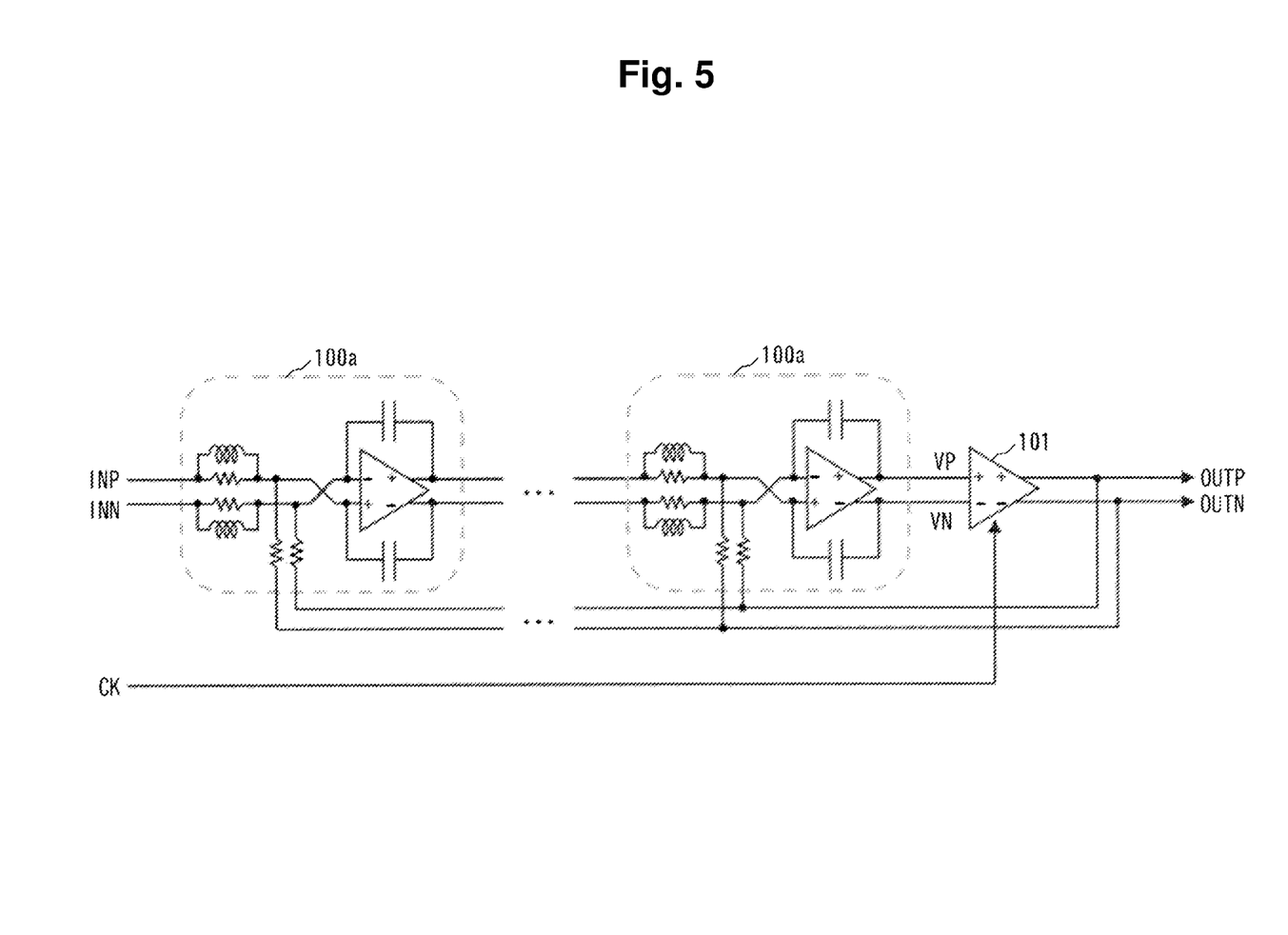
FIG. 5 is a block diagram illustrating a configuration of an Nth-order delta sigma modulator according to a third embodiment of the present invention.

FIG. 5 is a block diagram illustrating a configuration of an Nth-order delta sigma modulator of this embodiment. The configuration of each of N cascade-connected integrators 100a is the same as that of the first embodiment.

In this embodiment, inductors L1 and L2 for the N integrators 100a may of course be added in an off-chip manner outside the integrated circuit package of the Nth-order delta sigma modulator.

The embodiments described above are merely examples of applications to assist understanding of the principles of embodiments of the present invention, and many modifications can be made to the embodiments in practice without departing from the spirit of the present invention.

INDUSTRIAL APPLICABILITY

Embodiments of the present invention can be applied to delta sigma modulators.

REFERENCE SIGNS LIST 100a integrator
101 clocked comparator
A1 operational amplifier
Q1 to Q4 transistor
R1 to R4 input resistor
R5, R6 load resistor
C1, C2 feedback capacitor
L1, L2 compensation inductor
IS1 to IS3 constant current source.

The invention claimed is:

1. A delta sigma modulator for modulating an input signal to output an output signal, the delta sigma modulator comprising:
   an integrator configured to integrate differences between the input signal and the output signal; and
   a clocked comparator configured to output a result of comparison between an output of the integrator and a threshold at timing synchronized with a clock signal, the result being output as the output signal, wherein the integrator includes:
   an operational amplifier including an input terminal and an output terminal;
   an input resistor that has a first end to which the input signal is input, and a second end connected to the input terminal of the operational amplifier;
   a feedback capacitor that is connected between the input terminal and the output terminal of the operational amplifier;
   an inductor that is connected in parallel to the input resistor; and
   an integrated circuit package;
   wherein the operational amplifier, the input resistor, and the feedback capacitor are disposed in the integrated circuit package, wherein the feedback capacitor is disposed between the input terminal and the output terminal of the operational amplifier; and
   wherein the inductor is disposed outside the integrated circuit package.

2. The delta sigma modulator according to claim 1, wherein:

the integrator includes a plurality of integrators that are cascade-connected; and the integrator of a first stage of the plurality of integrators is configured to integrate a difference between the input signal and the output signal from the clocked comparator, and each of the integrators of a second and subsequent stages of the plurality of integrators is configured to integrate a difference between an output from an integrator in a previous stage and the output signal from the clocked comparator.

3. A delta sigma modulator for modulating an input signal to output an output signal, the delta sigma modulator comprising:

an integrator configured to integrate differences between the input signal and the output signal; and a clocked comparator configured to output a result of comparison between an output of the integrator and a threshold at timing synchronized with a clock signal, the result being output as the output signal, wherein the integrator includes:

an operational amplifier including an input terminal and an output terminal;

an input resistor that has a first end to which the input signal is input, and a second end connected to the input terminal of the operational amplifier;

a feedback capacitor that is connected between the input terminal and the output terminal of the operational amplifier; and an inductor that is connected in parallel to the input resistor, wherein the input terminal of the operational amplifier includes a positive-phase input terminal and a negative-phase input terminal;

wherein the output terminal of the operational amplifier includes a positive-phase output terminal and a negative-phase output terminal;

wherein the input resistor includes:

a first input resistor that has a first end to which the input signal on a positive-phase side is input, and a second end connected to the positive-phase input terminal of the operational amplifier; and a second input resistor that has a first end to which the input signal on a negative-phase side is input, and a second end connected to the negative-phase input terminal of the operational amplifier;

wherein the feedback capacitor includes:

a first feedback capacitor that has a first end connected to the negative-phase input terminal of the operational amplifier, and a second end connected to the positive-phase output terminal of the operational amplifier; and a second feedback capacitor that has a first end connected to the positive-phase input terminal of the operational amplifier, and a second end connected to the negative-phase output terminal of the operational amplifier;

wherein the inductor includes:

a first inductor that is connected in parallel to the first input resistor; and a second inductor that is connected in parallel to the second input resistor;

wherein the clocked comparator includes a positive-phase output terminal and a negative-phase output terminal; and wherein the integrator further includes:

a third input resistor that has a first end connected to the negative-phase output terminal of the clocked comparator, and a second end connected to the positive-phase input terminal of the operational amplifier; and a fourth input resistor that has a first end connected to the positive-phase output terminal of the clocked comparator, and a second end connected to the negative-phase input terminal of the operational amplifier.

4. A delta sigma modulator, comprising:

an integrator configured to integrate differences between an input signal of the delta sigma modulator and an output signal of the delta sigma modulator; and a clocked comparator configured to output a comparison result as the output signal of the delta sigma modulator, the comparison result being obtained by comparing an output of the integrator and a timing threshold, wherein the integrator includes:

an operational amplifier including an input terminal and an output terminal;

an input resistor that has a first end to which the input signal is input, and a second end connected to the input terminal of the operational amplifier;

an inductor that is connected in parallel to the input resistor; and an integrated circuit package;

wherein the operational amplifier, the input resistor, and a feedback capacitor are disposed in the integrated circuit package; and wherein the inductor is disposed outside the integrated circuit package.

5. The delta sigma modulator according to claim 4, wherein:

the integrator includes a plurality of integrators that are cascade-connected; and the integrator of a first stage of the plurality of integrators is configured to integrate a difference between the input signal and the output signal from the clocked comparator, and each of the integrators of a second and subsequent stages of the plurality of integrators is configured to integrate a difference between an output from an integrator in a previous stage and the output signal from the clocked comparator.

6. The delta sigma modulator according to claim 4, wherein the feedback capacitor is connected between the input terminal and the output terminal of the operational amplifier.

7. A delta sigma modulator, comprising:

an integrator configured to integrate differences between an input signal of the delta sigma modulator and an output signal of the delta sigma modulator; and a clocked comparator configured to output a comparison result as the output signal of the delta sigma modulator, the comparison result being obtained by comparing an output of the integrator and a timing threshold, wherein the integrator includes:

an operational amplifier including an input terminal and an output terminal;

an input resistor that has a first end to which the input signal is input, and a second end connected to the input terminal of the operational amplifier; and an inductor that is connected in parallel to the input resistor;

wherein the input terminal of the operational amplifier includes a positive-phase input terminal and a negative-phase input terminal;

wherein the output terminal of the operational amplifier includes a positive-phase output terminal and a negative-phase output terminal;

wherein the input resistor includes:
- a first input resistor that has a first end to which the input signal on a positive-phase side is input, and a second end connected to the positive-phase input terminal of the operational amplifier; and
- a second input resistor that has a first end to which the input signal on a negative-phase side is input, and a second end connected to the negative-phase input terminal of the operational amplifier;

wherein the clocked comparator includes a positive-phase output terminal and a negative-phase output terminal; and wherein the integrator further includes:
- a third input resistor that has a first end connected to the negative-phase output terminal of the clocked comparator, and a second end connected to the positive-phase input terminal of the operational amplifier; and
- a fourth input resistor that has a first end connected to the positive-phase output terminal of the clocked comparator, and a second end connected to the negative-phase input terminal of the operational amplifier.

8. The delta sigma modulator according to claim 7, wherein the inductor includes:
- a first inductor that is connected in parallel to the first input resistor.

9. The delta sigma modulator according to claim 7, wherein the inductor further includes:
- a second inductor that is connected in parallel to the second input resistor.

* * * * *